(12) United States Patent
Werner et al.

(10) Patent No.: US 11,968,809 B2
(45) Date of Patent: Apr. 23, 2024

(54) THERMALLY ACTIVATED RETRACTABLE EMC PROTECTION

(71) Applicant: International Business Machines Corporation, Armonk, NY (US)

(72) Inventors: John S. Werner, Fishkill, NY (US); Noah Singer, White Plains, NY (US); Samuel R. Connor, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/356,385

(22) Filed: Jul. 21, 2023

(65) Prior Publication Data
US 2023/0371214 A1 Nov. 16, 2023

Related U.S. Application Data

(62) Division of application No. 17/451,833, filed on Oct. 22, 2021, now Pat. No. 11,751,362.

(51) Int. Cl.
*H05K 9/00* (2006.01)
*H05K 5/00* (2006.01)
*H05K 7/20* (2006.01)

(52) U.S. Cl.
CPC .......... *H05K 7/20836* (2013.01); *H05K 5/00* (2013.01); *H05K 7/20009* (2013.01);
(Continued)

(58) Field of Classification Search
CPC ... H05K 9/0007–0062; H05K 7/20836; H05K 5/00; H05K 7/20009;
(Continued)

(56) References Cited

U.S. PATENT DOCUMENTS 3,518,355 A 6/1970 Luce
3,783,429 A 1/1974 Otte
(Continued)

FOREIGN PATENT DOCUMENTS

CN 112492864 A 3/2021
DE 102010031035 B3 1/2012
(Continued)

OTHER PUBLICATIONS

List of IBM Patents or Patent Applications Treated as Related (2023).
(Continued)

*Primary Examiner* — Jacob R Crum
(74) *Attorney, Agent, or Firm* — Nathan M. Rau

(57) ABSTRACT

A system and a method of providing electromagnetic compatibility (EMC) protection. A removable component is inserted into an end product. The removable component includes a retractable EMC protection apparatus. In response to the insertion of the removable component a shape memory alloy on the EMC protection apparatus is heated to a temperature above the activation temperature of the shape memory alloy. The shape memory alloy then changes from a first shape to a second shape in response to the heating. In response to the change in the shape of the shape memory alloy an EMC protection component of the EMC protection apparatus is inserted into an enclosure opening of the removable component.

6 Claims, 3 Drawing Sheets

(52) U.S. Cl.
CPC ......... *H05K 9/0009* (2013.01); *H05K 9/0015* (2013.01); *H05K 2201/0308* (2013.01)

(58) Field of Classification Search
CPC ......... H05K 2201/0308; H05K 7/1487; G05B 2219/24024
See application file for complete search history.

(56) References Cited

U.S. PATENT DOCUMENTS

| | | | |
|---|---|---|---|
| 5,091,823 A | 2/1992 | Kanbara | |
| 5,092,781 A | 3/1992 | Casciotti | |
| 5,483,423 A | 1/1996 | Lewis | |
| 5,563,390 A | 10/1996 | Demissy | |
| 5,637,001 A | 6/1997 | Nony | |
| 6,396,382 B1 | 5/2002 | Ross | |
| 6,501,019 B2 | 12/2002 | Sato | |
| 6,709,286 B1 | 3/2004 | Korsunsky | |
| 6,794,571 B1 | 9/2004 | Barringer | |
| 6,870,093 B2 | 3/2005 | King, Jr. | |
| 6,924,988 B2 | 8/2005 | Barringer | |
| 6,930,892 B2 | 8/2005 | Barringer | |
| 7,081,587 B1 | 7/2006 | Woolsey | |
| 7,215,536 B2 | 5/2007 | Hensley | |
| 7,532,469 B2 | 5/2009 | Frank | |
| 7,683,267 B2 | 3/2010 | Peets | |
| 7,837,503 B2 | 11/2010 | Hartzell | |
| 7,881,052 B2 | 2/2011 | Crippen | |
| 7,997,906 B2 | 8/2011 | Ligtenberg | |
| 8,638,570 B2 | 1/2014 | Liu | |
| 9,054,804 B2 | 6/2015 | Mccolloch | |
| 9,200,709 B2 | 12/2015 | Eidem | |
| 10,362,716 B2 | 7/2019 | Besterman | |
| 10,477,740 B2 | 11/2019 | Coppola | |
| 10,575,448 B1 | 2/2020 | Lewis | |
| 10,642,327 B1 | 5/2020 | Silvanto | |
| 2003/0221849 A1* | 12/2003 | Pommerenke | H05K 9/0015 174/383 |
| 2004/0150972 A1* | 8/2004 | Chen | H05K 9/0016 361/800 |
| 2005/0023904 A1 | 2/2005 | Cara | |
| 2006/0261710 A1 | 11/2006 | Frank | |
| 2006/0262512 A1 | 11/2006 | Klein | |
| 2007/0007037 A1 | 1/2007 | Diaferia | |
| 2007/0071575 A1 | 3/2007 | Rudduck | |
| 2007/0114060 A1 | 5/2007 | Barringer | |
| 2010/0149746 A1* | 6/2010 | Crippen | H05K 9/0062 361/679.33 |
| 2013/0155603 A1 | 6/2013 | Kaneko | |
| 2015/0070840 A1 | 3/2015 | Rappoport | |
| 2017/0178942 A1 | 6/2017 | Sakata | |
| 2019/0040675 A1 | 2/2019 | Alexander | |
| 2022/0407390 A1* | 12/2022 | Werker | H01R 13/719 |

FOREIGN PATENT DOCUMENTS

| | | |
|---|---|---|
| EP | 0665564 B1 | 1/1998 |
| JP | 2001168572 A | 6/2001 |
| JP | 2004207722 A | 7/2004 |

OTHER PUBLICATIONS

Notice of References Cited, U.S. Appl. No. 17/451,830, Mailed Feb. 16, 2023.
Notice of References Cited, U.S. Appl. No. 17/451,833, Mailed May 4, 2023.
Notice of References U.S. Appl. No. 17/451,839, mailed Sep. 28, 2023, 1 pg.

* cited by examiner

THERMALLY ACTIVATED RETRACTABLE EMC PROTECTION

BACKGROUND

The present disclosure relates to electromagnetic compatibility protection, and more specifically, to a thermally activated retractable EMC protection apparatus for a removeable component.

For enclosures such as servers, IO drawers, and processor drawers that are densely packed and have removable components such as power supplies and IO cards it is difficult to add EMI/EMC protection due to the space restrictions on either the removable component or the enclosure. Further, due to the tight space there is a high risk of damaging the protection during plug in or plug out events.

SUMMARY

According to embodiments of the present disclosure, a method of providing electromagnetic compatibility (EMC) protection is disclosed. A removable component is inserted into an end product. The removable component includes a retractable EMC protection apparatus. In response to the insertion of the removable component a shape memory alloy (SMA) on the EMC protection apparatus is heated to a temperature above the activation temperature of the shape memory alloy. The shape memory alloy then changes from a first shape to a second shape in response to the heating. In response to the change in the shape of the shape memory alloy an EMC protection component of the EMC protection apparatus is inserted into an enclosure opening of the removable component According to embodiments of the present disclosure a retractable electromagnetic compatibility (EMC) protection apparatus for a removable component is disclosed. The EMC protection apparatus includes a EMC shape memory alloy bracket, a shape memory alloy (SMA), an EMC protection bracket and an EMC protection device. The EMC SMA bracket is attached to a surface of the removable component. The shape memory alloy is attached to a portion of the EMC SMA bracket and is also attached to the EMC protection bracket. The EMC protection device is attached to the EMC protection bracket. The shape memory alloy is configured to change shape in response to an applied heat. This applied heat causes the EMC protection device to insert itself into an enclosure opening of the removable component to form an EMC seal.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
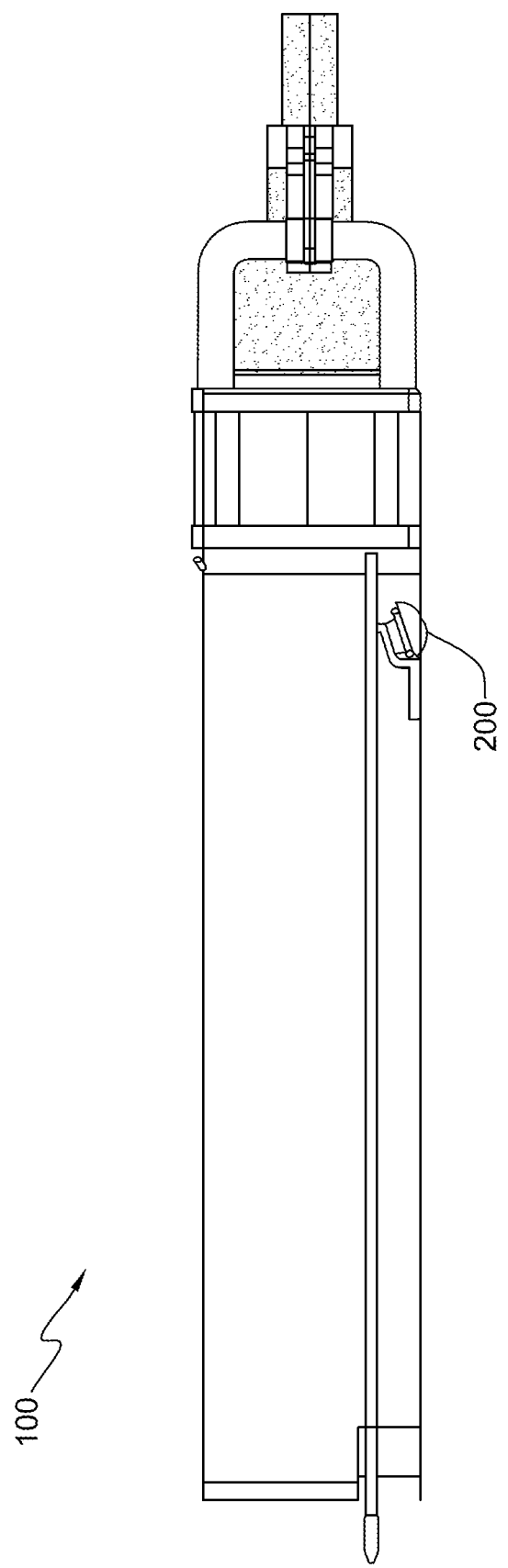
FIG. 1 is a diagrammatic illustration of a removable component according to embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to electromagnetic compatibility protection, more particular aspects relate to a thermally activated retractable EMC protection apparatus for removeable components. While the present disclosure is not necessarily limited to such applications, various aspects of the disclosure may be appreciated through a discussion of various examples using this context.

Enclosures such as servers IO draws, processor drawers, etc. are often densely packed with components. Some of these components are removable components, such as power supplies or IO cards. Due to space restrictions on either the removable component or the enclosure, it can be difficult to add electromagnetic interference (EMI)/electromagnetic compatibility (EMC) protection (e.g., gaskets, EMI springs, electrical noise absorbers) to the system. Often times, if EMC protection is added in tight areas, problems such as shearing of a gasket during a plug/unplug event or high plug force can occur. However, if EMC protection is not used, there is a high potential for radiated emissions leakage, lack of immunity, and/or high ESD susceptibility through the unprotected slot. As speeds increase and higher frequency content is introduced, there is higher chance that this could lead to the associated product failing EMC certification tests.

The present disclosure provides a solution to the above identified issues related to the removable components and the needed EMI/EMC protection. The present disclosure provides an apparatus wherein EMC gaskets and/or springs are retracted into a removable component on one or more sides that provides a low plug force and prevents shearing during a plug/unplug event. The present disclosure discusses an apparatus that contains an EMC gasket and/or springs that is connected to a shape memory alloy (SMA). When power is enabled to the removable component, the SMA expands which extends the EMC gaskets and/or springs to adequately seal openings around the removable component to minimize radiated emissions leakage, increase immunity, and lower ESD susceptibility. In some embodiments, the apparatus may be implanted on the removable component or on the enclosure side where the removable component inserts into an end product.

FIG. 1 is a diagrammatic illustration of a removable component 100 according to embodiments of the present disclosure. In FIG. 1 the removable component 100 is illustrated as a power supply unit (PSU). However, it could be any other type of removable component such as an input/output card, fan assembly, etc. The removable component 100 includes an EMC protection apparatus 200 that is located on the bottom of the removeable component 100. However, the EMC protection apparatus 200 can be located on other locations in the removable component 100. Further, in some embodiments, there can be multiple instances of the EMC protection apparatus 200 located on different sides of the removable component. While the present disclosure discusses the EMC protection apparatus 200 as being within the removable component, in some embodiments, the EMC protection apparatus 200 can be disposed on the end product and positioned such that when the removable component 100 is inserted, the protection apparatus 200 aligns with any openings in the removable component 100.

Figure 2:
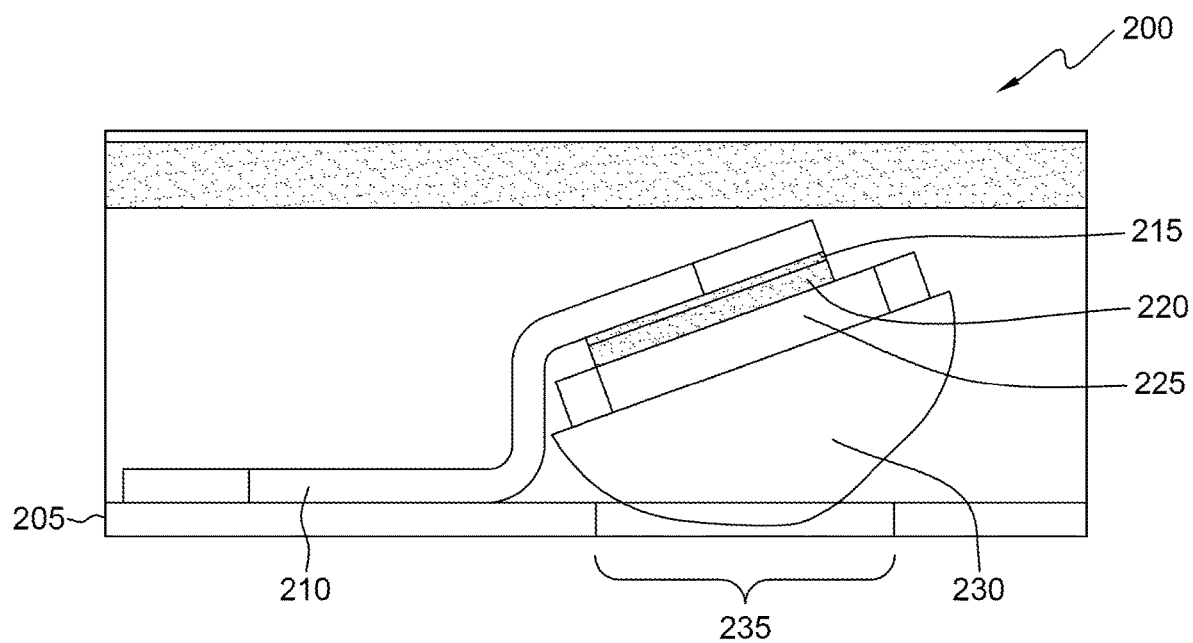
FIG. 2 is an enlarged side view of the thermally activated EMC protection apparatus within the removable component according to embodiments of the present disclosure.
Figure 3:
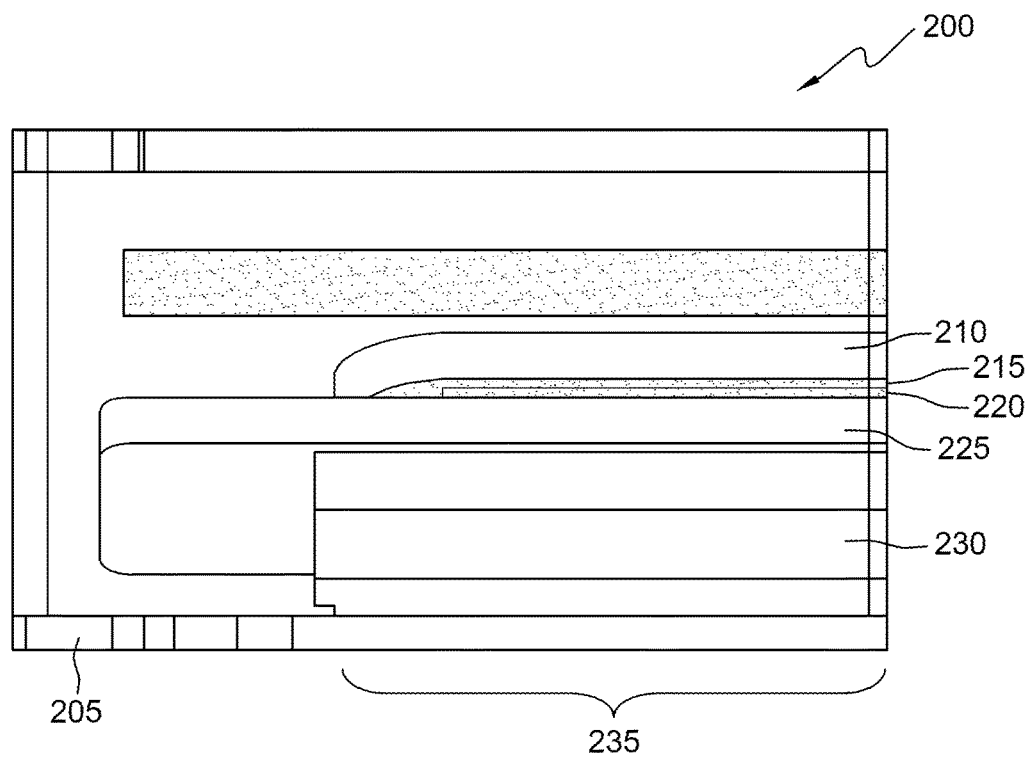
FIG. 3 is an alternate side view illustrating a portion of the EMC protection apparatus according to embodiments.

FIG. 2 is an enlarged side view of the thermally activated EMC protection apparatus 200 within the removable component 100 according to embodiments of the present disclosure. FIG. 3 is an alternate side view illustrating a portion of the EMC protection apparatus 200 according to embodiments. The EMC protection apparatus 200 includes an EMC SMA bracket 210, a heating pad 215, a shape memory alloy 220, an EMC protection bracket 225, and an EMC protection component 230. Also illustrated in FIG. 2 is an enclosure wall 205 of the removable component 100 and an enclosure opening 235 within the enclosure wall 205.

The EMC SMA bracket 210 is a component of the thermally activated EMC protection apparatus 200 that enables the protection apparatus to be attached to the enclosure wall 205 of the removable component 100. The EMC SMA bracket 210 has a bracket that is angled so as to create a wiping action between an EMI gasket and the mating metal surface of the removable component 100 during activation of the EMC protection apparatus 200. This wiping action helps to cut through any anti-fingerprint coatings or oxidation on the metal surface that would prevent making a good, low-resistance electrical connection. In one embodiment the angle is 20 degrees. However, other angles can be used depending on the amount of wiping desired.

The heating pad 215 is a component of the EMC protection apparatus that is configured to heat the shape memory alloy 220 to a temperature that is above its activation temperature. The heating pad 215 is attached to the EMC SMA bracket 210. The heating pad receives power from the removeable component 100 once the removable component 100 has been plugged into the end product. In some embodiments the power can come from a voltage level within the removable component 100. The heating pad 215 can be a series of wires that are coiled such that when power is applied to the wires, the internal resistance of the wires generate heat. However, other approaches of generating heat within the heating pad 215 can be used.

The shape memory alloy 220 is a component of the EMC protection apparatus that is configured to change shape in response to heating. The shape memory alloy 220 is connected to both the heating pad 215 (when present) and the EMC protection bracket 225. In FIG. 2 the shape memory alloy is illustrated in a contracted state. This contracted state is achieved when the shape memory alloy is below its activation temperature. The shape memory alloy can be made from an alloy of copper aluminum and nickel or an alloy of nickel and titanium. Other alloys of copper or iron can be used such as zinc, copper, gold, and iron, iron, manganese and silicon, and copper, zinc and aluminum. However, any shape memory material can be used. The shape memory alloy 220 is heated by the heating pad 215 and once the temperature of the shape memory alloy 220 exceeds its activation temperature, the shape memory alloy expands to its second shape. However, in some embodiments, the heating pad 215 is omitted and the internal heat generated by the removable component 100 during operation is sufficient to allow the shape memory alloy 220 to exceed its activation temperature.

The EMC protection component 230 is a component of the EMC protection apparatus 200 that is configured to insert into the enclosure opening and seal the removable component 100. The EMC protection component 230 is connected to the EMC protection bracket 225. The EMC protection component, when engaged, blocks the transmission of electromagnetic energy into and out of the removable component through the enclosure opening 235 as well as seams and/or openings between removable component 100 and the end product in which it is inserted to minimize the likelihood of electromagnetic interference. The EMC protection component 230 is illustrated as an EMC/EMI gasket. However, the EMC protection component can be an EMC spring, an EMC absorber, or any other type of EMC containment mechanism. In some embodiments, one or more guide pins can be used to ensure that EMC protection 230 lands in the desired position consistently. These pins can be mounted on the enclosure wall 205 of the removable component 100.

When the shape memory alloy 220 is in its contracted state, the EMC protection component 230 is retracted inside of the removable component 100. When it is retracted into the removable component 100 the component 100 can be inserted into the end product with low plugging force required, and also minimizing the chance that the EMC protection component will be sheared during the installation process.

Figure 4:
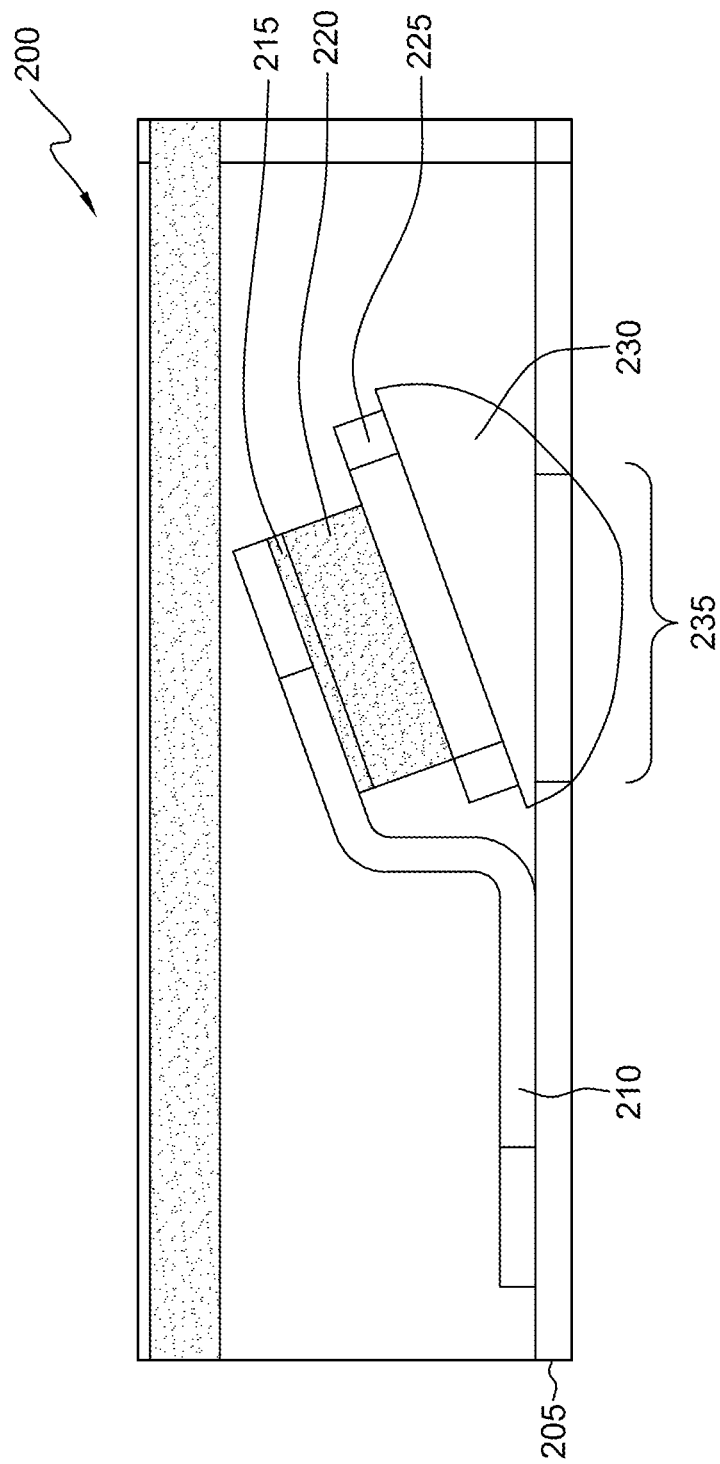
FIG. 4 is an enlarged side view of the thermally activated EMC protection apparatus within the removable component following the activation of the shape memory alloy according to embodiments.

FIG. 4 is an enlarged side view of the thermally activated EMC protection apparatus 200 within the removable component 100 following the activation of the shape memory alloy 220 according to embodiments. When the shape memory alloy 220 is in its expanded state as shown in FIG. 4, the EMC protection component 230 is extended to both seal enclosure opening 235 as well as extend through enclosure opening 235 to make contact with a neighboring metal surface in the end product that removable component 100 inserts into. In this state, a proper EMC seal is created to minimize radiated emissions leakage, increase immunity, and lower ESD susceptibility of the removable component. In some embodiments this compression results in the EMC protection device 230 being compressed between 30 and 70 percent of its original height. (i.e., height prior to insertion). In some embodiments the EMC protection device 230 has a bell or other curved shape such that the curve extends towards or into the enclosure opening. However, any shape can be used for the EMC protection device 230 so long as it can completely seal the enclosure opening. By not engaging the EMC protection device 230 prior to the insertion of the removable component 100 into the end product, a lower plug force is obtained than would be possible using traditional methods.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of providing electromagnetic compatibility (EMC) protection comprising:
    inserting a removable component into an end product, the removable component including a retractable EMC protection apparatus;
    heating a shape memory alloy on the EMC protection apparatus to a temperature above an activation temperature of the shape memory alloy;
    changing, by the shape memory alloy, from a first shape to a second shape; and
    in response to changing from a first shape to a second shape, inserting an EMC protection component into an enclosure opening of the removable component to form an EMC seal.

2. The method of claim 1 wherein heating further comprises:
    activating a heating pad on the EMC protection apparatus, wherein the heating pad is in contact with the shape memory alloy.

3. The method of claim 1 further comprising:
    operating the removable component to generate operating heat; and
    wherein the operating heat is sufficient to heat the shape memory alloy to a temperature above the activation temperature.

4. The method of claim 1 further comprising:
    wiping the EMC protection device against the enclosure opening and an adjacent surface through the enclosure opening during inserting.

5. The method of claim 1 wherein the EMC protection device is compressed in response to inserting.

6. The method of claim 5 wherein the EMC protection device is compressed between 30% and 70% of an original height of the EMC protection device.

* * * * *